(12) United States Patent
Matsueda

(10) Patent No.: US 12,029,075 B2
(45) Date of Patent: Jul. 2, 2024

(54) DISPLAY DEVICE

(71) Applicant: Wuhan Tianma Micro-Electronics Co., Ltd., Wuhan (CN)

(72) Inventor: Yojiro Matsueda, Kanagawa (JP)

(73) Assignee: Wuhan Tianma Micro-Electronics Co., Ltd., Wuhan (CN)

( * ) Notice: Subject to any disclaimer, the term of this patent is extended or adjusted under 35 U.S.C. 154(b) by 412 days.

(21) Appl. No.: 17/534,894

(22) Filed: Nov. 24, 2021

(65) Prior Publication Data

US 2022/0199726 A1 Jun. 23, 2022

(30) Foreign Application Priority Data

Dec. 23, 2020 (JP) ................. 2020-213258

(51) Int. Cl.
*H10K 59/121* (2023.01)
*H10K 59/131* (2023.01)
*H10K 59/35* (2023.01)

(52) U.S. Cl.
CPC ..... *H10K 59/1213* (2023.02); *H10K 59/1216* (2023.02); *H10K 59/131* (2023.02); *H10K 59/353* (2023.02)

(58) Field of Classification Search
CPC ................................................ H10K 59/1213
See application file for complete search history.

(56) References Cited

U.S. PATENT DOCUMENTS

| | | |
|---|---|---|
| 2003/0030601 A1 | 2/2003 | Komiya |
| 2007/0115226 A1 | 5/2007 | Jung et al. |
| 2017/0345367 A1 | 11/2017 | Ka et al. |
| 2020/0161399 A1* | 5/2020 | Park ............... H10K 59/1213 |
| 2022/0020306 A1* | 1/2022 | Park ............... G09G 3/2096 |
| 2022/0036808 A1 | 2/2022 | Wu et al. |
| 2022/0122535 A1* | 4/2022 | Jung ............... H10K 59/1213 |
| 2022/0223101 A1 | 7/2022 | Wu et al. |

FOREIGN PATENT DOCUMENTS

CN 111799318 A 10/2020

OTHER PUBLICATIONS

Office Action issued Feb. 18, 2023 in Chinese Application No. 202111375929.9.

* cited by examiner

*Primary Examiner* — Peter M Albrecht
(74) *Attorney, Agent, or Firm* — Sughrue Mion, PLLC

(57) ABSTRACT

A display device includes a first display region and a second display region having a lower pixel density than the first display region. A first pixel circuit in the first display region includes a first drive transistor, a first storage capacitor that stores a control voltage of the first drive transistor, and a first switch transistor that writes a data signal to the first storage capacitor. A second pixel circuit in the second display region includes a second drive transistor, a second storage capacitor that stores a control voltage of the second drive transistor, and a second switch transistor that writes a data signal to the second storage capacitor. A channel width of the second drive transistor is greater than a channel width of the first drive transistor. A channel width of the second switch transistor is greater than a channel width of the first switch transistor.

9 Claims, 13 Drawing Sheets

DISPLAY DEVICE

CROSS-REFERENCE TO RELATED APPLICATIONS

This non-provisional application claims priority under 35 U.S.C. § 119(a) on Patent Application No. 2020-213258 filed in Japan on Dec. 23, 2020, the entire content of which is hereby incorporated by reference.

BACKGROUND

This disclosure relates to a display device.

OLED (organic light-emitting diode) elements are current-driven light-emitting elements, and thus, have advantages such as low power consumption, wide viewing angle, and high contrast ratio, and are anticipated to contribute to the development of flat panel displays.

The display region of an OLED display device sometimes includes regions with differing pixel densities. For example, in some mobile devices such as smartphones and tablet-type computers, a camera for capturing images is disposed under the display region. In order for the camera to receive light from the outside, the camera is disposed under a region with a lower pixel density than the surrounding area.

SUMMARY

An aspect of this disclosure is a display device including: a first display region; and a second display region having a lower pixel density than the first display region. A first pixel circuit in the first display region includes: a first drive transistor that controls a drive current amount to a light-emitting element; a first storage capacitor that stores a control voltage of the first drive transistor; and a first switch transistor that writes a data signal to the first storage capacitor. A second pixel circuit in the second display region includes: a second drive transistor that controls a drive current amount to a light-emitting element; a second storage capacitor that stores a control voltage of the second drive transistor; and a second switch transistor that writes a data signal to the second storage capacitor. A channel width of the second drive transistor is greater than a channel width of the first drive transistor. A channel width of the second switch transistor is greater than a channel width of the first switch transistor.

It is to be understood that both the foregoing general description and the following detailed description are exemplary and explanatory and are not restrictive of this disclosure.

DETAILED DESCRIPTION OF EMBODIMENTS

Figure 1:
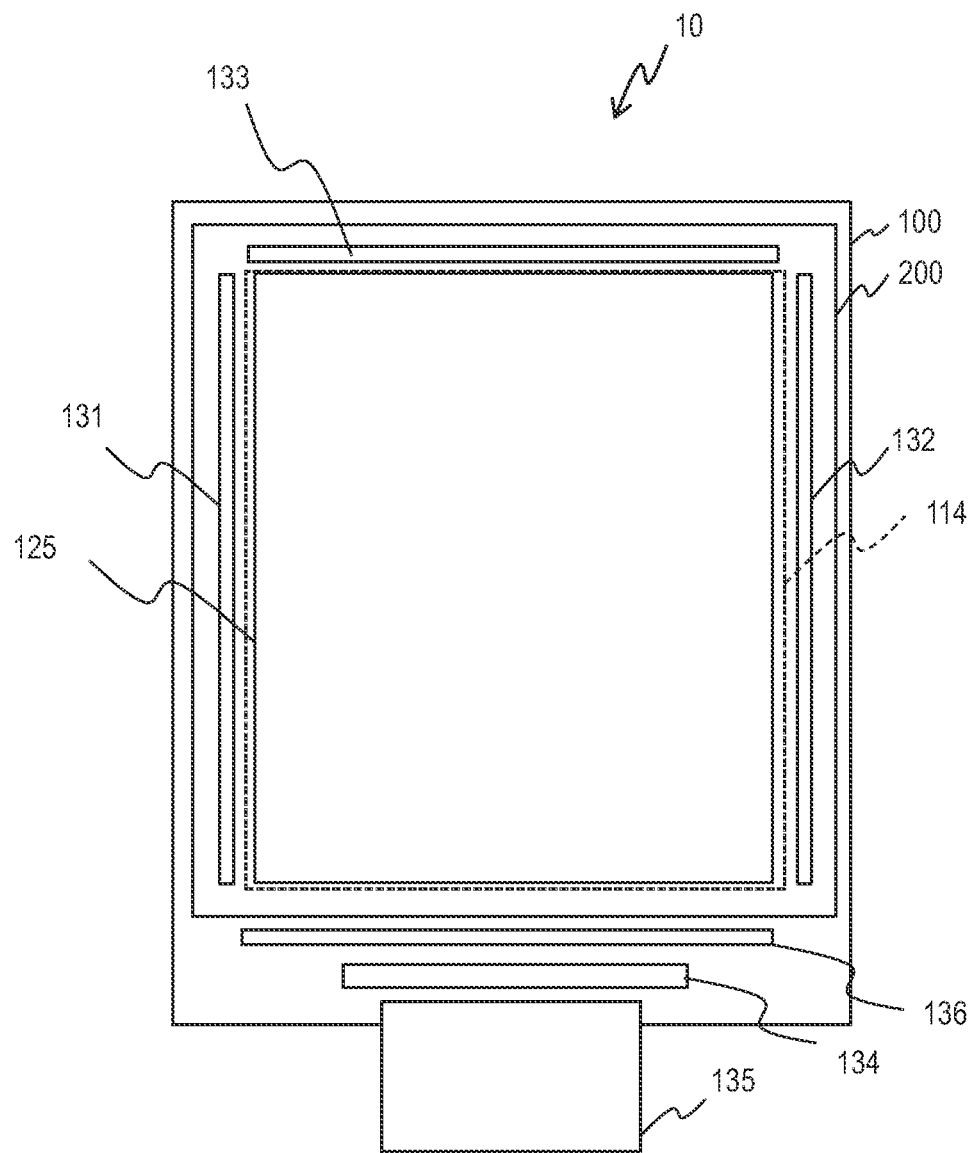
FIG. 1 schematically shows a configuration example of an OLED display device.

Hereinafter, embodiments of this disclosure will be described with reference to the accompanying drawings. It should be noted that the embodiments are merely examples to implement this disclosure and not to limit the technical scope of this disclosure.

In the description below, "pixel" indicates the minimum unit in a display region and is an element that emits light of a single color, sometimes referred to as a "subpixel." A plurality of pixels of differing colors, such as a set of red, blue, and green pixels, constitute an element that displays one color dot, and this element is sometimes referred to as a main pixel. Below, for clarification, if distinguishing between elements that each display a single color and elements that collectively display multiple colors, these elements are referred to as subpixels and main pixels, respectively. The characteristics of the present specification can be applied to display devices that perform monochrome display, and display regions thereof are constituted of monochrome pixels.

Below, configuration examples of a display device will be explained. Display regions of the display device include a second display region with a relatively low pixel density (also referred to as a low density or low resolution region), and a first display region with a relatively high pixel density (also referred to as a normal region or a normal resolution region). In order to mitigate a decrease in display quality of an image in the display regions, the luminance of pixels in the low density region is set to be higher than the luminance of pixels in the normal region for image data with the same gradation level. A plurality of low density regions with lower pixel densities than the normal region may be provided, and each of the low density regions may differ in pixel density.

In the example described below, the light-emitting elements of the pixels are current-driven elements, and are OLED (organic light-emitting diode) elements, for example. Thus, pixels in the low density region are supplied a larger current than pixels in the normal region for image data with the same gradation level.

The luminance can be changed by adjusting the data signal such that pixels in a region with a lower pixel density are supplied a larger current than pixels in the normal region with a higher pixel density, but this would result in a major increase in the data signal amplitude, causing an increase in power consumption by the display device.

Below, an OLED display device including transistors with differing channel widths in the normal region and the low density region will be described. The channel width of drive transistors in the low density region is greater than the channel width of drive transistors in the normal region. The drive transistors in the low density region apply, to the OLED elements, a larger drive current than drive transistors in the normal region for image pixel data indicating the same gradation level (luminance) in the image frame.

As a result, it is possible to increase the luminance in the low density region while suppressing the data signal voltage range (also referred to, simply, as the data signal range) in the low density region, and it is possible to reduce the overall power consumption in the OLED display device.

By setting the channel width of the drive transistors in a region where the pixel density is 1/n so as to be a factor of n greater than the channel width of the drive transistors in a region where the pixel density is high, it is possible to increase the luminance of pixels in the region where the pixel density is low by a factor of n even with the same data signal, for example. In this case, the data signal amplitude does not increase, and thus, the power consumption of the display device does not increase even when there are regions with differing pixel densities.

In one embodiment of the present specification, the channel width of switch transistors that write data signals to storage capacitors within the low density region is greater than the channel width of switch transistors that write data signals to storage capacitors within the normal region.

The drive transistors are controlled by a drive voltage stored by the storage capacitors. The drive voltage of the drive transistors fluctuates according to the switching of the switch transistors, which write the data signals to the storage capacitors, from ON to OFF. The degree of fluctuation is dependent on the gate capacitances of the drive transistors and the switch transistors. The gate capacitances are dependent on the respective channel widths.

Thus, if the channel width of drive transistors in a region with a low pixel density is set so as to be a factor of n greater than the channel width of drive transistors in a region with a high pixel density, the gate potential of the same drive transistor changes, which means that a current that is a factor of n greater does not result therefrom, causing a conspicuous boundary to appear between regions with differing pixel densities.

By increasing the channel width of the data-writing switch transistors in addition to the drive transistors, it is possible to reduce the change in drive voltage fluctuation of the storage capacitors resulting from the increased channel width of the drive transistors. In one embodiment of the present specification, the OLED display device writes the same data signal to the normal region and the low density region for the same gradation level (luminance) of image data inputted from an external source. As described above, by increasing the channel width of both the drive transistor and the data-writing switch transistors, it is possible to reduce the difference in final gate voltages of the drive transistors stored by the storage capacitors between the normal region and the low density region.

As a result, it is possible to reduce the difference in gate potential between drive transistors in display regions with differing pixel densities while mitigating an increase in power consumption of the display device, and thus, it is possible to improve the uniformity of the display luminance. As a result, the boundary between regions of differing pixel densities is less conspicuous.

A device layout by which manufacturing variation is reduced while ensuring process margins is important in manufacturing pixel circuits with differing channel widths. One embodiment of the present embodiment uses the same pixel electrode shape for the normal region and the low density region while changing the channel widths of the semiconductor layer, thereby changing the channel widths of the transistors. This results in greater ease of design and manufacturing of the structure of the pixel circuits. Also, by adopting a prescribed pixel electrode structure (including shape and position), it is possible to improve the size adjustment ratio accuracy of the transistors.

[Configuration of Display Device]

An overall configuration of a display device according to one embodiment of this specification will be described with reference to FIG. 1. In order to increase the clarity of the description, dimensions, shapes, and the like of depicted objects are sometimes exaggerated. Below, an OLED display device will be described as an example of the display device.

FIG. 1 schematically shows a configuration example of an OLED display device 10. The OLED display device 10 is configured so as to include a TFT (thin film transistor) substrate 100 on which OLED elements (light-emitting elements) are formed, and a sealing structure 200 that seals in the OLED elements. Control circuits are disposed around a cathode electrode formation region 114 on the outside of a display region 125 of the TFT substrate 100. Specifically, a scanning driver 131, an emission driver 132, an electrostatic discharge protection circuit 133, a driver IC 134, and a demultiplexer 136 are provided.

The driver IC 134 is connected to an external device via an FPC (flexible printed circuit) 135. The scanning driver 131 drives scanning lines of the TFT substrate 100. The emission driver 132 drives emission control lines to control the emission of light from each pixel. The electrostatic discharge protection circuit 133 prevents damage from electrostatic discharge to elements on the TFT substrate. The driver IC 134 is installed using an anisotropic conductive film (ACF), for example.

The driver IC 134 supplies a control signal including a power source and a timing signal to the scanning driver 131 and the emission driver 132. Additionally, the driver IC 134 supplies power and a data signal to the demultiplexer 136. The demultiplexer 136 sequentially outputs the output of one pin of the driver IC 134 to d (d being an integer of 2 or greater) data lines. The demultiplexer 136 switches the data line to which to output the data signal from the driver IC 134 d times within a scanning period, thereby driving a number of data lines that is d times the number of output pins of the driver IC 134.

[Pixel Circuit Configuration]

Figure 2:
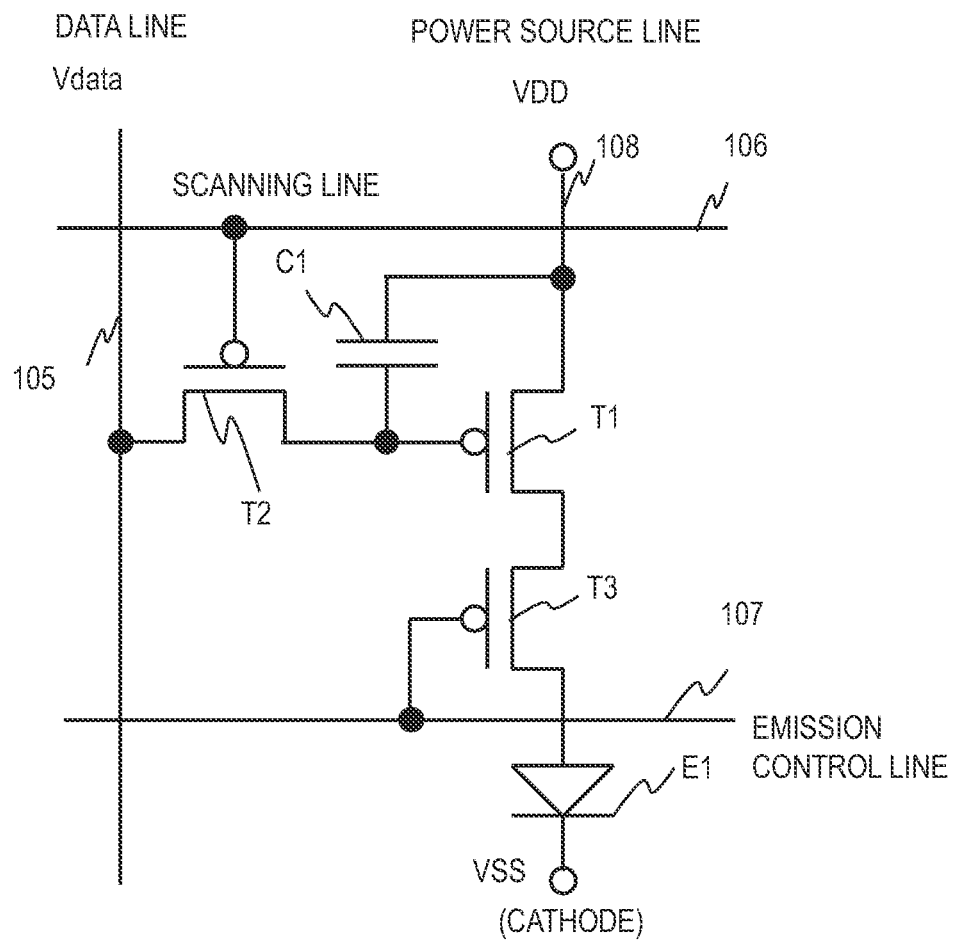
FIG. 2 shows a configuration example of a pixel circuit.

A plurality of pixel circuits that control the current supplied to an anode electrode of each of a plurality of subpixels are formed on the TFT substrate 100. FIG. 2 shows a configuration example of a pixel circuit. Each pixel circuit includes a drive transistor T1, a selection transistor T2, an emission transistor T3, and a storage capacitor C1. The pixel circuit controls the emission of light from an OLED element E1. The transistors are TFTs.

In the pixel circuit of FIG. 2, a circuit configuration for compensating the threshold voltage of the drive transistor is omitted. The pixel circuit of FIG. 2 is an example, and the pixel circuit may have another circuit configuration. The pixel circuit of FIG. 2 uses P-channel type TFTs, but the pixel circuit may use N-channel type TFTs.

The selection transistor T2 is a switch for selecting the subpixels. The selection transistor T2 is a P-channel type (P-type) TFT, and the gate terminal thereof is connected to the scanning line 106. The source terminal is connected to the data line 105. The drain terminal is connected to the gate terminal of the drive transistor T1.

The drive transistor T1 is a transistor (drive TFT) for driving the OLED element E1. The drive transistor T1 is a P-type TFT, and the gate terminal thereof is connected to the drain terminal of the selection transistor T2. The source terminal of the drive transistor T1 is connected to a power source line 108 that transmits an anode power source potential VDD. The drain terminal is connected to the source terminal of the emission transistor T3. The storage capacitor C1 is formed between the gate terminal and the source terminal of the drive transistor T1.

The emission transistor T3 is a switch that controls the supply and stoppage of the drive current to the OLED element E1. The emission transistor T3 is a P-type TFT, and the gate terminal thereof is connected to the emission control line 107. The source terminal of the emission transistor T3 is connected to the drain terminal of the drive transistor T1. The drain terminal of the emission transistor T3 is connected to the OLED element E1. A cathode power source potential VSS is applied to the cathode of the OLED element E1.

Next, the operation of the pixel circuit will be described. The scanning driver 131 outputs a selection pulse to the scanning line 106, switching the selection transistor T2 to the ON state. The data voltage supplied from the driver IC 134 via the data line 105 is stored in the storage capacitor C1. The storage capacitor C1 retains the stored voltage over one frame period. The stored voltage causes the conductance of the drive transistor T1 to change in an analog manner, and the drive transistor T1 supplies a forward bias current corresponding to the emission gradation to the OLED element E1.

The emission transistor T3 is positioned on the supply path for the drive current. The emission driver 132 outputs a control signal to the emission control line 107, thereby controlling the emission transistor T3 to be ON/OFF. When the emission transistor T3 is in the ON state, the drive current is supplied to the OLED element E1. When the emission transistor T3 is in the OFF state, the supply is stopped. By controlling the emission transistor T3 to be ON/OFF, it is possible to control the lighting period (duty cycle) within one frame period.

[Pixel Layout]

Figure 3:
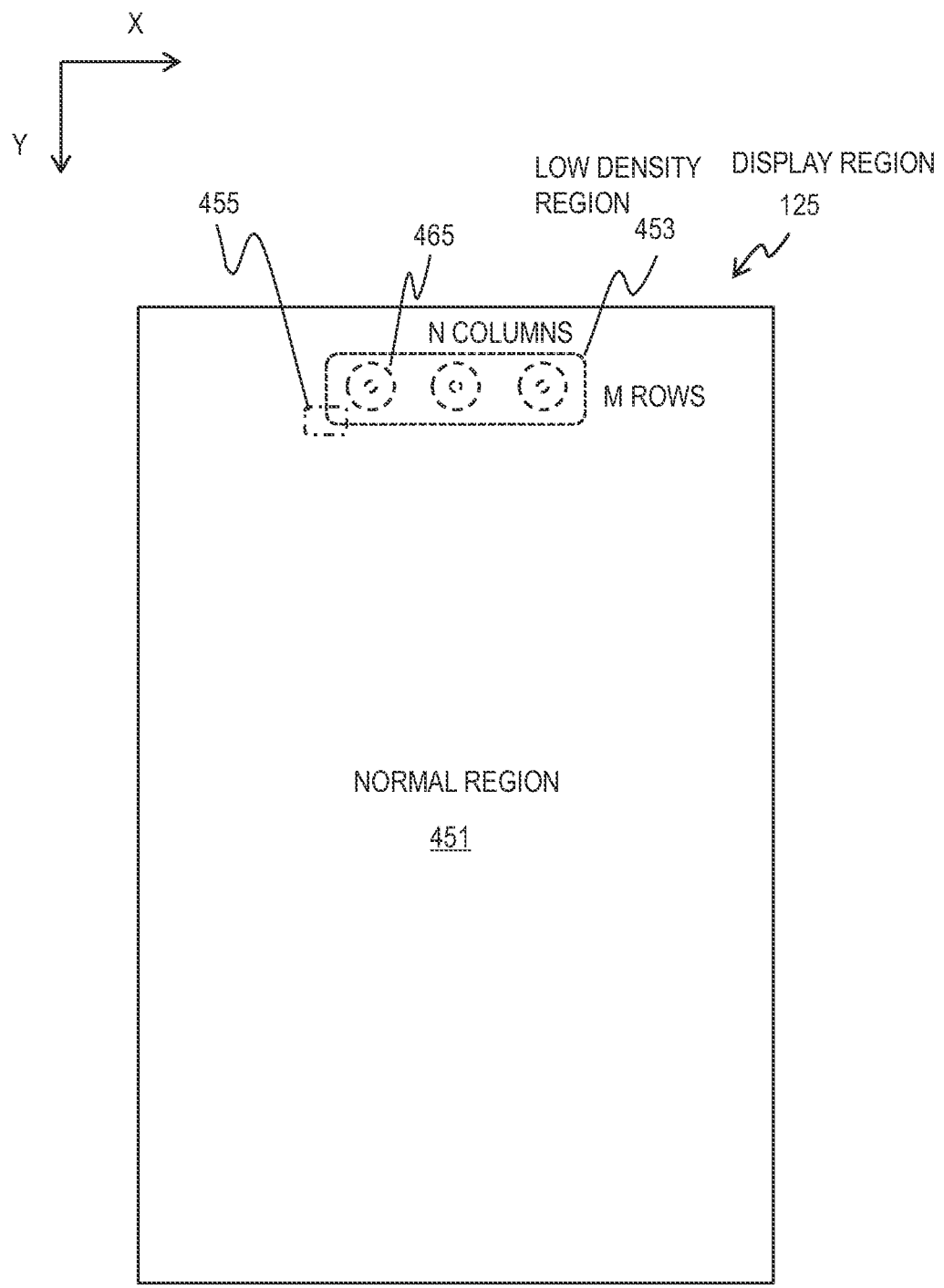
FIG. 3 schematically shows a display region.

FIG. 3 schematically shows the display region 125. The OLED display device 10 is installed on a mobile device such as a smartphone or a tablet device, for example. The display region 125 includes a normal region 451 having a normal pixel density, and a low density region 453 having a pixel density (resolution) lower than the pixel density (resolution) of the normal region 451. One or more cameras 465 are disposed below the low density region 453. In FIG. 3, one of the plurality of cameras is indicated with the reference character 465 as an example. Below, the subpixels or main pixels in the display region 125 are sometimes referred to as display subpixels or display main pixels.

The low density region 453 is disposed on the viewer side of the camera 465, and the camera 465 captures objects on the viewer side using light passing through the low density region 453. In order not to interfere with the image capture performed by the camera 465, the pixel density of the low density region 453 is set to be lower than the pixel density of the surrounding normal region 451. The control device (not shown) transmits data of an image captured by the camera 465 to the OLED display device 10, for example. FIG. 3 indicates a region under which a camera is disposed as an example of the low density region, the characteristics of the present specification can be applied to a display device including a region with a relatively low pixel density for other purposes.

The low density region 453 is constituted of N columns by M rows of main pixels. The main pixel columns are constituted of main pixels arrayed along the Y axis, which is the vertical direction of FIG. 3. The main pixel rows are constituted of main pixels arrayed along the X axis, which is the horizontal direction of FIG. 3.

Figure 4:
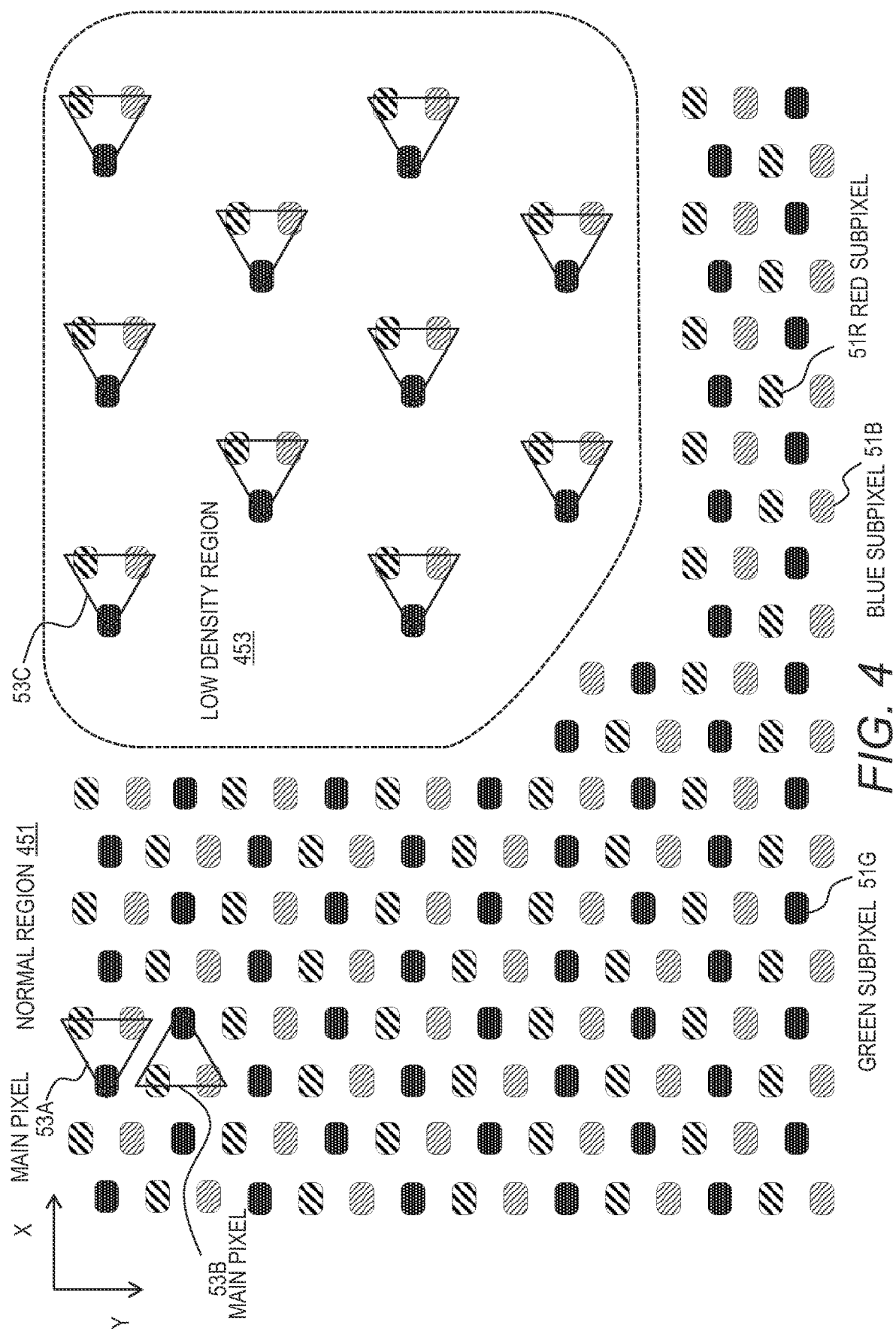
FIG. 4 shows details of the region of FIG. 3 surrounded by a one-dot chain line.

FIG. 4 shows details of the region 455 of FIG. 3 surrounded by a one-dot chain line. FIG. 4 shows a pixel layout in a delta-nabla arrangement (also referred to, simply, as a delta arrangement). The characteristics of the present embodiment can also be applied to a display device having a different pixel layout.

The region 455 is a region in the vicinity of the boundary between the normal region 451 and the low density region 453. In the example shown in FIG. 4, the pixel density of the low density region 453 is ¼ that of the normal region 451. The subpixels in the low density region 453 are controlled so as to emit light at a luminance that is quadruple that of the subpixels in the normal region 451 for the same image data.

The display region 125 is constituted of a plurality of red subpixels 51R, a plurality of green subpixels 51G, and a plurality of blue subpixels 51B that are in an in-plane arrangement. In FIG. 4, one red subpixel, one green subpixel, and one blue subpixel are indicated by reference characters as examples. In FIG. 4, quadrilaterals (with rounded corners) having the same hatching pattern indicate subpixels of the same color. In FIG. 4, the shape of the subpixels is a quadrilateral, but any shape may be used the subpixels, which may be hexagonal or octagonal, for example.

A subpixel column is an array of subpixels in the same X axis position and extending in the Y axis direction. In the subpixel column, the red subpixels 51R, the blue subpixels 51B, and the green subpixels 51G are arranged cyclically. The subpixels in the same subpixel column are connected to the same data line, for example. A subpixel row is an array of subpixels of the same color in the same Y axis position and extending in the X axis direction. The subpixels in the same subpixel row are connected to the same scanning line, for example.

In the configuration example of FIG. 4, the normal region 451 includes two types of main pixels arranged in a matrix: first main pixels 53A and second main pixels 53B. In FIG. 4, only one of the first main pixels is indicated by a reference character 53A as an example. Also, only one of the second main pixels is indicated by a reference character 53B as an example. If subpixel rendering is used, the main pixels in the image data from an external source do not match the main pixels of the panel.

In FIG. 4, each of the first main pixels 53A is in a triangular arrangement with one vertex on the left side and two vertices on the right side. Also, each of the second main pixels 53B is in a triangular arrangement with one vertex on the right side and two vertices on the left side.

In the first main pixel 53A, the red subpixel 51R and the blue subpixel 51B are arranged consecutively in the same subpixel column. The subpixel column including the green subpixels 51G is adjacent to the left of the subpixel column including the red subpixels 51R and the blue subpixels 51B. The green subpixel 51G is positioned midway between the red subpixel 51R and the blue subpixel 51B in the Y axis position.

In the second main pixel 53B, the red subpixel 51R and the blue subpixel 51B are arranged consecutively in the same subpixel column. The subpixel column including the green subpixels 51G is adjacent to the right of the subpixel column including the red subpixels 51R and the blue subpixels 51B. The green subpixel 51G is positioned midway between the red subpixel 51R and the blue subpixel 51B in the Y direction.

The low density region 453 is constituted of main pixels 53C having the same configuration as the first main pixels 53A. FIG. 4 shows five columns by four rows of the main pixels 53C. The main pixels 53C are arranged regularly, with the distance between the main pixels along the X axis and the Y axis being uniform. Also, adjacent main pixel rows are offset by a half pitch.

In order to enable image capture by the camera 465, a transmissive region (not shown) that lets through light from the viewer side to the camera 465 is provided in a suitable arrangement between adjacent main pixels 53C and between the low density region 453 and the normal region 451.

The subpixel layout of the low density region 453 has a configuration excluding some of the subpixels from the layout of the normal region 451. The subpixels of the low density region 453 constitute subpixel rows and subpixel columns together with the subpixels of the normal region 451. Each subpixel column of the low density region 453 constitutes one subpixel column together with the corresponding subpixel column of the normal region 451, the one subpixel column being connected to the same data line. Each subpixel row of the low density region 453 constitutes one subpixel row together with the corresponding subpixel row of the normal region 451, the one subpixel row being connected to the same scanning line.

[Wiring Layout]

Figure 5:
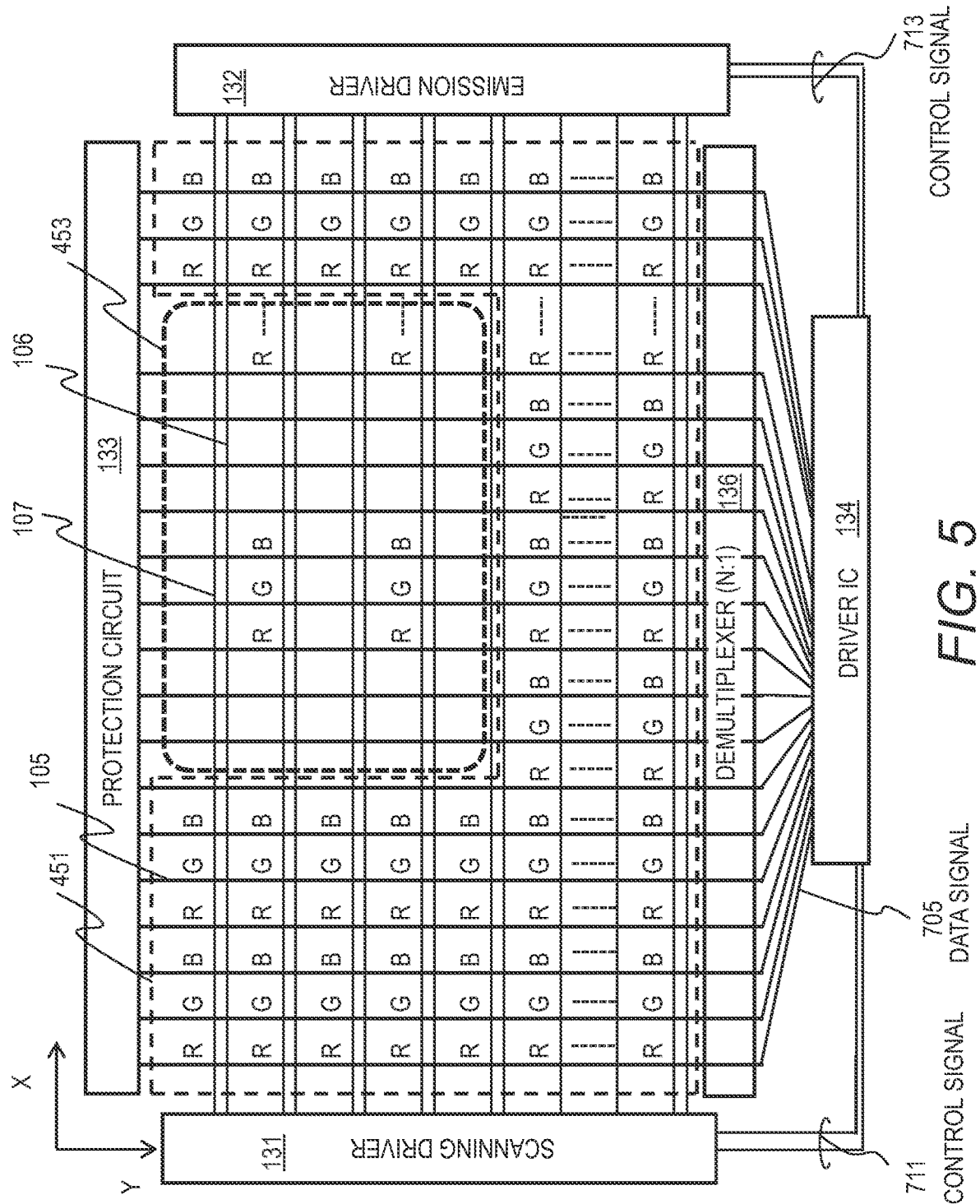
FIG. 5 schematically shows a layout of control lines on a TFT substrate.

Below, a wiring layout example of the OLED display device 10 will be explained. FIG. 5 schematically shows the layout of control wiring lines on the TFT substrate 100, and in the configuration example of FIG. 5, the layout of the pixel circuits in the normal region 451 is a stripe arrangement. Specifically, the subpixel columns extending in the Y axis are each constituted of subpixels of the same color. The subpixel rows extending along the X axis are constituted of red subpixels, green subpixels, and blue subpixels arranged cyclically. The low density region 453 has a configuration excluding some of the pixels from the pixel layout of the normal region 451. The empty region in the low density region 453 has no pixel circuits including OLED elements formed therein, and only has a transmissive region and wiring lines.

The transistors constituting the pixel circuits of the main pixels 53A and 53C adjacent to the transmissive region are suitably shielded from light (not shown). This is in order to prevent the light assist effect from occurring in the transistor as a result of external light entering the transmissive region from the viewer side when the camera captures images and the external light also entering the pixel circuit via the TFT substrate 100 and the thin film layer forming the OLED elements. When the light assist effect occurs, the threshold voltage of the transistor shifts, causing a change in the drive current.

The plurality of scanning lines 106 extend along the X axis from the scanning driver 131. The plurality of emission control lines 107 extend along the X axis from the emission driver 132. In FIG. 5, one scanning line and one emission control line are, respectively, indicated by the reference characters 106 and 107 as examples.

In the configuration example of FIG. 5, the scanning lines 106 transmit selection signals for the normal region 451 and the low density region 453. Also, the emission control lines 107 transmit an emission control signal to the normal region 451 and the low density region 453.

The driver IC 134 transmits a control signal to the scanning driver 131 via a wiring line 711, and transmits the control signal to the emission driver 132 via a wiring line 713. The driver IC 134 controls the timing of the scanning signal (selection pulse) from the scanning driver 131 and the emission control signal from the emission driver 132 on the basis of image data (image signal) from an external source.

The driver IC 134 supplies the data signal of the subpixels of the normal region 451 and the low density region 453 to the demultiplexer 136 via a wiring line 705. FIG. 5 indicates one wiring line with the reference character 705 as an example. The driver IC 134 determines the data signal of each pixel circuit corresponding to each subpixel of the normal region 451 and the low density region 453 according to the gradation level of one or more subpixels in a frame of image data from an external source.

The demultiplexer 136 sequentially outputs the output of one pin of driver IC 134 to N (N being an integer of 2 or greater) data lines 105 within a scanning period. In FIG. 5, one of the plurality of data lines extending along the Y axis is indicated with the reference character 105 as an example.

[Light Emission Control Method]

Below, a light emission control method for subpixels of the OLED display device 10 will be explained. The driver IC 134 controls the light emission luminance of each of the subpixels (pixel circuits) of the normal region 451 and the low density region 453. Typically, the drive current of the drive transistor T1 is proportional to the channel width, assuming the same gate voltage. The channel width of the drive transistors T1 in the low density region 453 is greater than the channel width of drive transistors in the normal region 451 in one embodiment of the present specification. As a result, it is possible to realize a high luminance with a lower data signal voltage in the low density region 453, thereby reducing power consumption. The configuration of the pixel circuits, or in other words, the number of transistors and capacitors and the connective relationship therebetween are the same for the normal region 451 and the low density region 453.

In one embodiment of the present specification, the driver IC 134 makes a determination to use the same data signal for pixel circuits at the same luminance (gradation level) in the normal region 451 and the low density region 453. Thus, if the luminance of the subpixels in the low density region 453 is required to be quadruple the luminance of the subpixels of the normal region 451, then the channel width of the drive transistors T1 of the low density region 453 is set to be quadruple the channel width of the drive transistors T1 in the normal region 451, for example. The same applies for the channel length. Different data signals may be transmitted to pixel circuits of the same luminance in the normal region 451 and the low density region 453. The design of the channel width of the drive transistors T1 in the low density region 453 is based on the data signal voltage applied thereto.

Figure 6:
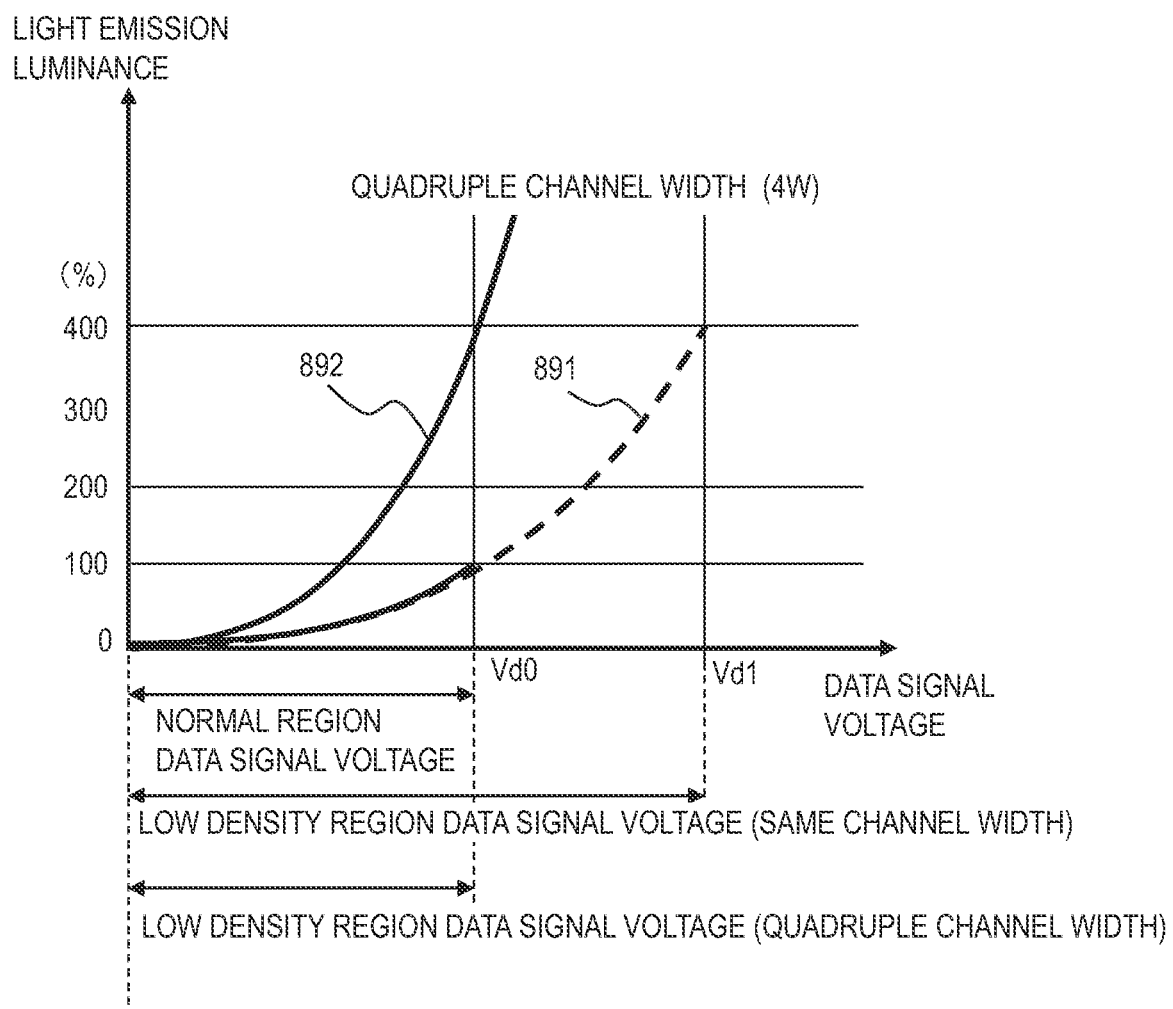
FIG. 6 shows a graph of light emission luminance characteristics of subpixels in a low density region.

FIG. 6 shows a graph of light emission luminance characteristics of subpixels in the low density region 453. In this example, the density of the low density region 453 is a quarter of the density of the normal region 451, and the luminance of the subpixels in the low density region 453 is quadruple the luminance of the subpixels in the normal region 451, assuming the same image signal.

The X axis represents the data signal voltage and the Y axis represents the light emission luminance. The line 891 is a luminance characteristic curve of the subpixels (OLED elements) in the low density region 453 for a case in which the channel width of the drive transistors T1 in the low density region 453 is equal to the channel width of drive transistors T1 in the normal region 451. This characteristic matches the characteristic of subpixels in the normal region 451.

In order to achieve the gradation level for white, a data signal voltage Vd1 greater than a data signal voltage Vd0 applied to the subpixels of the normal region 451 needs to be applied to the subpixels of the low density region 453.

The line 892 is a luminance characteristic curve of the subpixels in the low density region 453 for a case in which the channel width of the drive transistors T1 in the low density region 453 is quadruple the channel width of drive transistors T1 in the normal region 451. By quadrupling the channel width, the luminance of the subpixels in the low density region 453 is increased to 400% at the same data signal voltage Vd0. That is, at the same voltage range as the data signal voltage range (minimum luminance to maximum luminance) of the normal region 451, the luminance of the subpixels in the low density region 453 can be quadrupled. By narrowing the data signal voltage range of the low density region 453, it is possible to reduce the overall power consumption in the OLED display device.

The data signal voltage range of the low density region 453 need not match the data signal voltage range of the normal region 451. By setting the channel width of the drive transistors T1 in the low density region 453 to be greater than the channel width of drive transistors T1 in the normal region 451, it is possible to narrow the data signal voltage range of the low density region 453 for which a high luminance is required.

[Data Signal Writing Transistor]

Next, the configuration of the transistors that write data signals to the storage capacitor will be described. In one embodiment of the present specification, the channel width of transistors that write data signals to the storage capacitors within the low density region 453 is greater than the channel width of the transistors that write data signals to the storage capacitors within the normal region 451. In the pixel circuit configuration described with reference to FIG. 2, the transistor T2 is an example of a first or second switch transistor that writes a data signal to the storage capacitor.

When the transistor T2 switches from ON to OFF and transmission of the data signal from the data line 105 to the storage capacitor C1 ends, the voltage stored in the storage capacitor C1 (gate potential of the drive transistor T1) changes according to the change in the gate potential of the transistor T2. The drive transistor T1 is controlled by the final voltage stored by the storage capacitor C1.

A drive voltage fluctuation $\Delta V$ (gate potential fluctuation of the drive transistor T1) when the transistor T2 is OFF can be represented by the following formula.

$$\Delta V = (VGH - VGL) Cgd / (Cgd + Cstg + Cdtft)$$

VGH and VGL represent the high level and low level potentials of the scanning line 106. Cgd represents the gate/drain capacitance of the data-writing switch transistor T2. Cstg represents the capacitance of the storage capacitor C1. Cdtft represents the channel capacitance of the drive transistor T1.

As the channel width of the drive transistor T1 increases, the gate capacitance Cdtft of the drive transistor T1 increases. As indicated by the formula above, as the gate capacitance Cdtft of the drive transistor T1 increases, the drive voltage fluctuation $\Delta V$ decreases. That is, if only the channel width of the drive transistors T1 of the low density region 453 is increased, the voltage of the storage capacitors C1 in the low density region 453 differs from the voltage of the storage capacitors in the normal region 451.

As the channel width of the data-writing switch transistor T2 increases, the gate/drain capacitance Cgd of the data-writing switch transistor T2 increases. As indicated by the formula above, as the gate/drain capacitance Cgd of the data-writing switch transistor T2 increases, the drive voltage fluctuation $\Delta V$ increases. In other words, by increasing the channel width of the switch transistors T2, it is possible to reduce the change in voltage fluctuation of the storage capacitors resulting from the increased channel width of the drive transistors T1.

In one embodiment of the present specification, the gate potential fluctuation of the drive transistors T1 due to the switching of the switch transistor T2 from ON to OFF is the same for the normal region 451 and the low density region 453. The channel width of the switch transistors T2 is determined such that the drive voltage fluctuation of the normal region 451 is equal to the drive voltage fluctuation $\Delta V$ of the low density region 453.

In designing the pixel circuits, the channel width of the drive transistors T1 is determined according to the luminance required for the low density region 453, for example. Thereafter, the channel width of the switch transistors T2 may be determined through an arithmetic expression or a simulation such that the change in drive voltage fluctuation resulting from the increase in channel width of the drive transistors T1 is canceled out.

The configuration of the pixel circuits is not limited to the configuration example of FIG. 2. In the pixel circuit shown in FIG. 2, the switch transistor T2 is connected to the gate of the drive transistor, but in another pixel circuit configuration example, the data-writing switch transistor may be connected to the source of the drive transistor.

Figure 7:
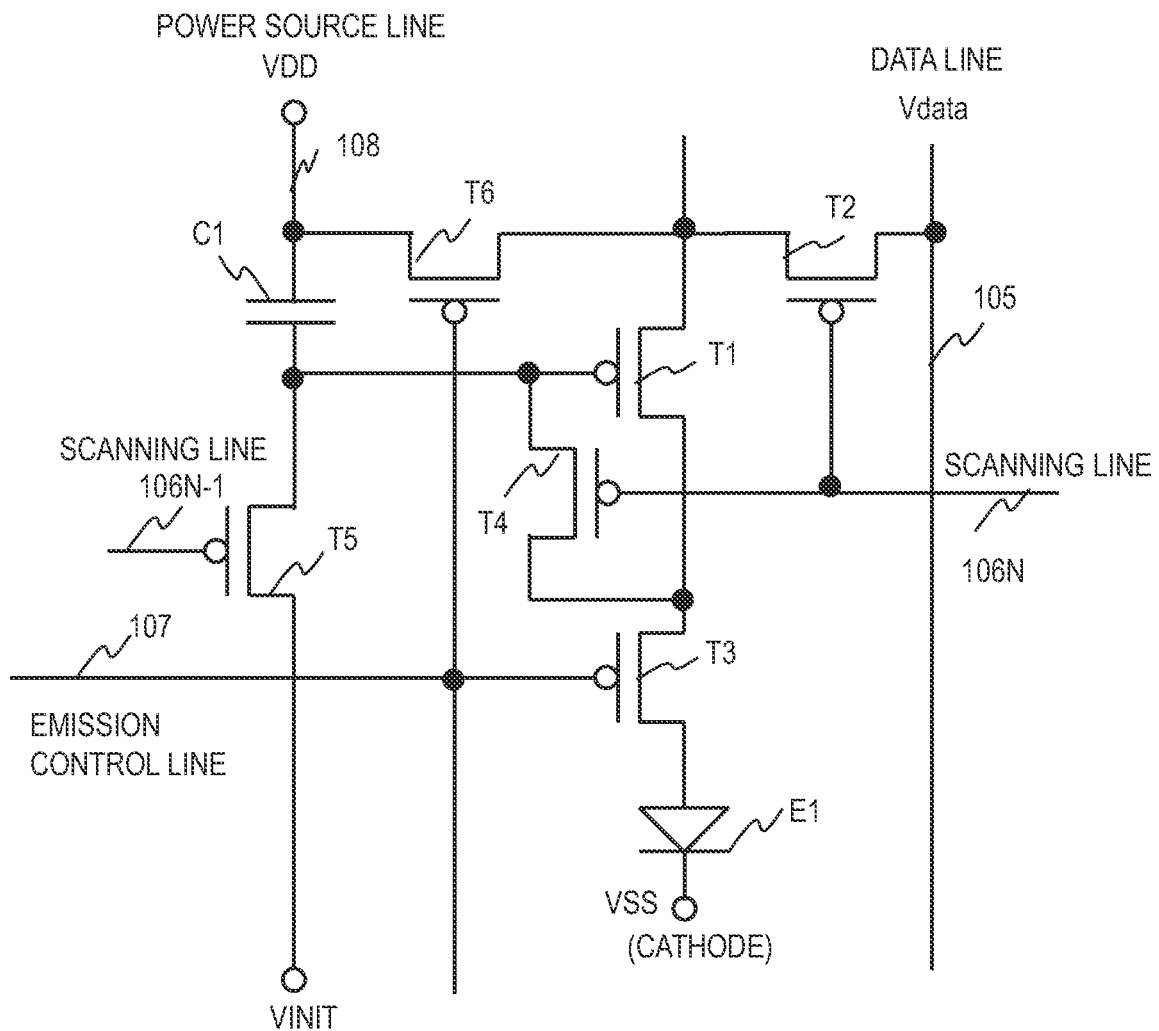
FIG. 7 shows another configuration example of the pixel circuit.

FIG. 7 shows another configuration example of the pixel circuit. The pixel circuit includes transistors T4, T5, and T6 in addition to the drive transistor T1, the data signal writing transistor T2, and the light emission control transistor T3. The transistors T1 to T6 are all P-type TFTs. The transistor T2 is connected between the source of the drive transistor T1 and the data line 105. The transistor T2 is an example of the first or second transistor that writes a data signal to the storage capacitor. The transistor T4 is an example of a third or fourth switch transistor that electrically connects the gate to the drain of the drive transistor T1 when in an ON state.

The transistor T4 is connected to the gate and the drain of the drive transistor T1. The transistor T4 electrically connects the gate to the drain of the drive transistor T1 when in an ON state. The transistor T5 is connected to the gate of the drive transistor T1 and a power source line that applies a power source potential VINIT. The transistor T6 is connected to the source of the drive transistor T1 and the power source line 108 that applies the power source potential VDD.

The scanning line 106N-1 transmits a scanning signal from the N−1th output terminal of the scanning driver 131. The scanning line 106N transmits a scanning signal from the Nth output terminal of the scanning driver 131. The transistors T2 and T4 are controlled by the scanning signal of the scanning line 106N. The transistor T5 is controlled by the scanning signal of the scanning line 106N-1. The transistor T6 is controlled by the light emission control signal transmitted by the emission control line 107.

After the scanning line 106N-1 applies a low level pulse to the pixel circuit, the scanning line 106N applies a low level pulse to the pixel circuit. During the period in which these pulses are applied, the light emission control signal transmitted by the emission control line 107 is at a high level. When the scanning line 106N-1 is at a low level, the transistor T5 is ON and other transistors are OFF. Thus, an initial potential VINIT is applied to the gate of the drive transistor T1 to initialize the gate potential.

Next, when the scanning line 106N is at a low level, the transistors T2 and T4 are ON. Other transistors are OFF. The transistor T4 is ON, and thus, the drive transistor T1 is in a diode connection state. The data signal from the data line 105 is written to the storage capacitor C1 via the transistors T2, T1, and T4. At this time, the voltage compensating the threshold voltage of the drive transistor T1 is written to the storage capacitor C1.

Then, the transistors T2 and T4 are turned OFF and the light emission control transistors T3 and T6 are turned ON. The drive current from the drive transistor T1 is applied to the OLED element E1 and the OLED element E1 emits light.

In the pixel configuration example shown in FIG. 7, the data-writing switch transistor T2 causes a voltage fluctuation to occur in the series capacitance of the channel capacitance of the drive transistor T1 and the storage capacitor C1. The drive voltage fluctuation ΔV for when the switch transistor T2 switches from ON to OFF is represented by the following formulas:

$$\Delta V = (VGH - VGL)Cgd/(Cgd + Cdtft2)$$

$$1/Cdtft2 = 1/Cstg + 1/Cdtft$$

VGH and VGL represent the high level and low level of the scanning line. Cgd represents the gate/drain capacitance of the switch transistor T2. Cstg represents the capacitance of the storage capacitor C1. Cdtft represents the channel capacitance of the drive transistor T1.

As described in the pixel circuit example of FIG. 2, the channel width of the switch transistors T2 in the low density region 453 is greater than the channel width of switch transistors T2 in the normal region 451. As a result, the change in voltage fluctuation of the storage capacitors resulting from the increased channel width of the drive transistors T1 is reduced. Also, in one embodiment of the present specification, the gate potential fluctuation of the drive transistors T1 due to the switching of the switch transistor T2 from ON to OFF is the same for the normal region 451 and the low density region 453. The channel width of the switch transistors T2 of the low density region 453 is set such that the drive voltage fluctuation ΔV resulting from the switch transistors T2 is the same in the normal region 451 and the low density region 453.

In the configuration example shown in FIG. 7, the switch transistor T4, which enables threshold compensation by setting the drive transistor T1 to the diode connection state, is also set ON/OFF at the same time as the data-writing switch transistor T2. When the transistor T4 is turned OFF, a drive voltage fluctuation occurs. The effect from the transistor T4 being turned OFF is seen in the gate of the drive transistor T1, and a voltage fluctuation occurs in the parallel capacitance of the channel capacitance of the drive transistor T1 and the storage capacitor C1. The drive voltage fluctuation ΔV is represented by the following formulas:

$$\Delta V = (VGH - VGL)Cgd2/(Cgd2 + Cdtft + Cstg)$$

VGH and VGL represent the high level and low level of the scanning line. Cgd2 represents the gate/drain capacitance of the switch transistor T4. Cstg represents the capacitance of the storage capacitor C1. Cdtft represents the channel capacitance of the drive transistor T1.

The above description of the data-writing transistor T2 can also be applied to the switch transistor T4 for diode connection. That is, the channel width of the switch transistors T4 in the low density region 453 may be set to be greater than the channel width of switch transistors T4 in the normal region 451.

Also, in one embodiment of the present specification, the gate potential fluctuation of the drive transistors T1 due to the switching of the switch transistor T4 from ON to OFF is the same for the normal region 451 and the low density region 453. The channel width of the switch transistors T4 of the low density region 453 is set such that the drive voltage fluctuation ΔV resulting from the switch transistors T4 is the same in the normal region 451 and the low density region 453.

Figure 8:
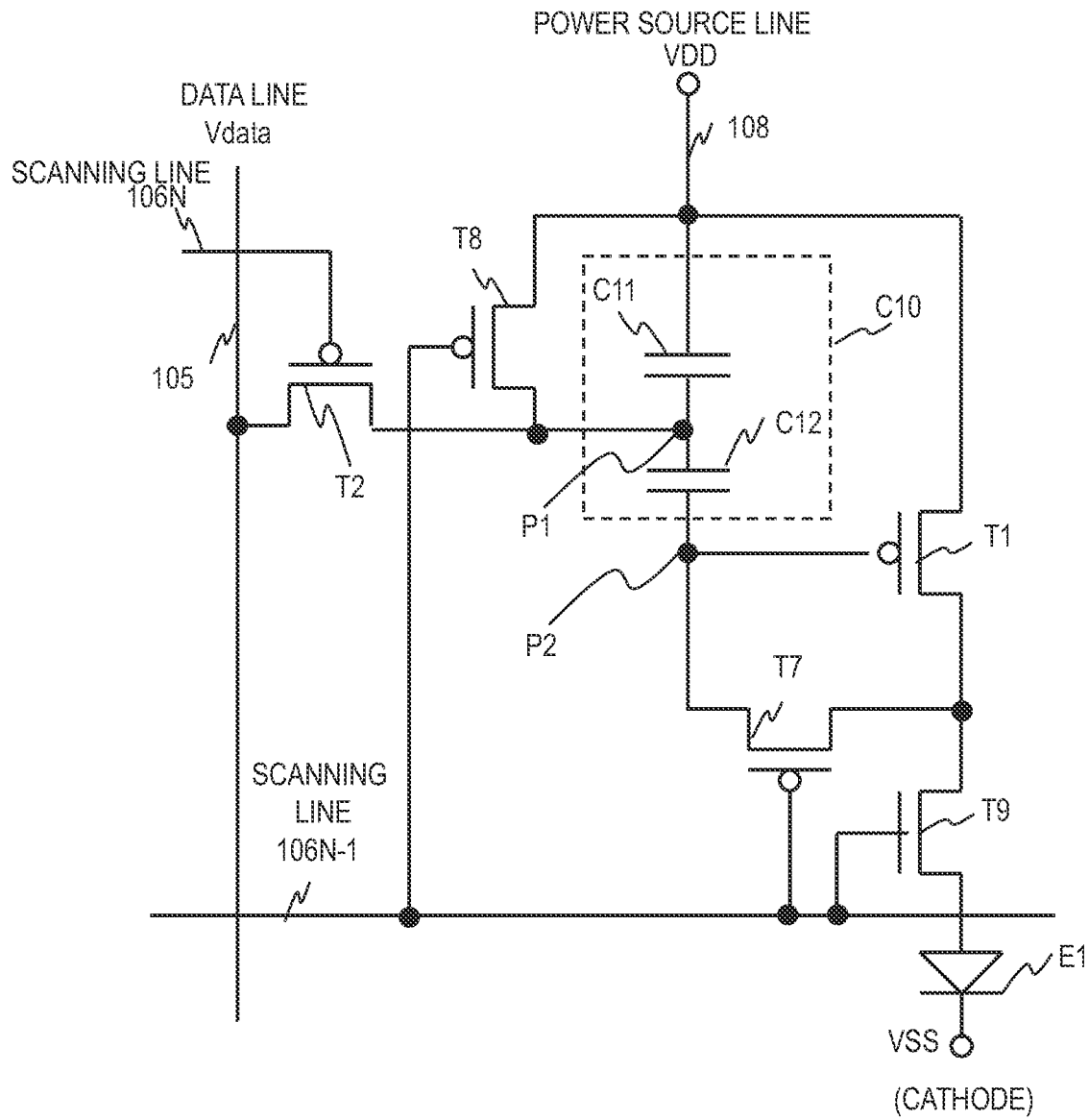
FIG. 8 shows another configuration example of the pixel circuit.

FIG. 8 shows another configuration example of the pixel circuit. The pixel circuit includes transistors T7 and T8 in addition to the drive transistor T1, the data signal writing transistor T2, and the light emission control transistor T9. The transistor T9 is an N-type TFT and the other transistors are P-type TFTs. The storage capacitor C10 is constituted of two capacitors C11 and C12 connected in series.

The transistor T2 is connected between a node P1, between the capacitors C11 and C12, and the data line 105. The transistor T2 is an example of the first or second switch transistor that writes a data signal to the storage capacitor. The transistor T7 is connected to the gate and the drain of the drive transistor T1. The transistor T7 electrically connects the gate to the drain of the drive transistor T1 when in an ON state. The transistor T8 is connected to the power source line 108 that applies the power source potential VDD via the node P1 between the capacitors C11 and C12. The transistor T9 is connected between the drain of the drive transistor T1 and the OLED element E1.

The scanning line 106N-1 transmits a scanning signal from the N−1th output terminal of the scanning driver 131. The scanning line 106N transmits a scanning signal from the Nth output terminal of the scanning driver 131. The transistor T2 is controlled by the scanning signal of the scanning line 106N. The transistors T9, T7, and T8 are controlled by the scanning signal of the scanning line 106N-1.

After the scanning line 106N-1 applies a low level pulse to the pixel circuit, the scanning line 106N applies a low level pulse to the pixel circuit. When the scanning line 106N-1 is at a low level, the transistors T7 and T8 are ON and the transistors T2 and T9 are OFF. During this period, a threshold compensation voltage is written to the storage capacitor C10.

Next, the scanning line 106N-1 switches to a high level, and the scanning line 106N switches to a low level. When the scanning line 106N is at a low level, the transistor T2 is ON. During this period, the data signal is written to the storage capacitor C10 via the transistor T2. Then, the scanning line 106N switches to a high level and the light emission period of the OLED element E1 starts.

In the pixel circuit example shown in FIG. 8, the storage capacitor C10 is constituted of two capacitors C11 and C12. After writing of the data signal is complete, a potential fluctuation ΔVp1 of the node P1 is represented by the following formula:

$$\Delta Vp1 = (VGH - VGL)Cgd/(Cgd + Cstg1 + Cvth2)$$

VGH and VGL represent the high level and low level of the scanning line. Cgd represents the gate/drain capacitance of the switch transistor T2. Cstg1 represents the capacitance of the capacitor C11. Cvth2 represents the series capacitance of the capacitor C12 and the drive transistor T1 from the perspective of the node P1.

The change amount of the P1 node potential leads to a change in potential of the node P2 through capacitance coupling. Thus, the final gate potential fluctuation amount Vp2 of the drive transistor T1 is represented by the following formula:

$\Delta V p2 = \Delta V p1 \cdot Cstg2/(Cstg2+Cdtft)$

Cstg2 represents the capacitance of the capacitor C12. Cdtft represents the channel capacitance of the drive transistor T1. $\Delta V p1$ and $\Delta V p2$ decrease as the channel width of the drive transistor T1 increases. By increasing the channel width of the data-writing switch transistor T2, it is possible to reduce the change in gate potential fluctuation resulting from the increased channel width of the drive transistor T1.

[Device Structure]

Below, the structure of the drive transistors in the pixel circuits will be described. The drive transistors have the same configuration parameters in the normal region 451 and the low density region 453 aside from the channel widths of the semiconductor layers in one embodiment of the present specification. This results in greater ease of design and manufacturing of the pixel circuits.

Figure 9:
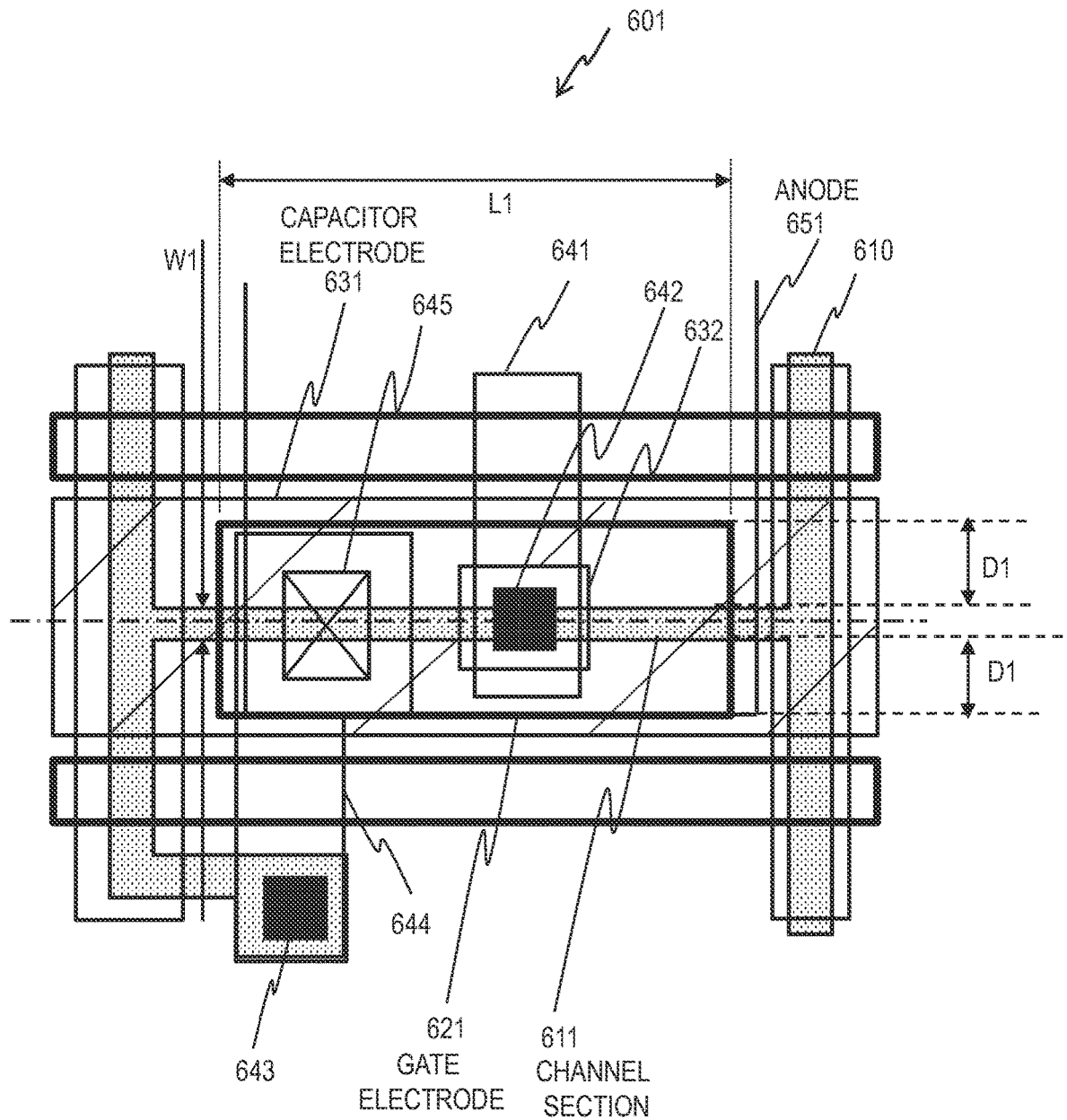
FIG. 9 is a plan view that schematically shows the structure of a drive transistor in a normal region.

FIG. 9 is a plan view that schematically shows the structure of a drive transistor 601 in the normal region 451. For ease of description, some constituent elements are omitted. The drive transistor 601 includes a channel section 611 in a semiconductor layer 610 and a gate electrode 621 that covers the channel section 611 in a plan view.

The channel section 611 is rectangular and extends in the horizontal direction of FIG. 9. A width W1 of the channel section 611 is the vertical dimension in FIG. 9, and is constant. The length of the channel section 611 is the horizontal dimension in FIG. 9. The gate electrode 621 is rectangular. In the configuration example of FIG. 9, the channel section 611 is a section of the semiconductor layer covered by the gate electrode 621, and a length L1 of the channel section 611 matches the horizontal dimension of the gate electrode 621.

The gate electrode 621 and the channel section 611 are horizontally symmetrical in FIG. 9. The center axis of the channel section 611 extending in the horizontal direction (length direction) matches the center axis of the gate electrode 621 extending in the length direction. Also, distances D1 (minimum value) from each edge of the channel section 611 in the vertical direction (width direction) to each edge of the gate electrode 621 are the same on both sides. The distance D1 is sometimes referred to as a channel margin or a gate margin. In the configuration example of FIG. 9, the distance D1 is constant.

The drive transistor 601 includes a capacitor electrode 631 that covers the gate electrode 621 in a plan view. A storage capacitance is formed between the gate electrode 621 and the capacitor electrode 631. An opening 632 is formed in the capacitor electrode 631, and an electrode 641 in a source/drain metal layer is connected to the gate electrode 621 via a contact section 642 that passes through the opening 632. The electrode 641 connects the gate electrode 621 of the drive transistor to other circuit elements within the pixel circuit.

A drain electrode 644 in the source/drain metal layer is connected to the semiconductor layer via the contact section 643, and is connected to an anode electrode 651 via a contact section 652. The channel section 611 is connected to the anode electrode 651 via the drain electrode 644.

Figure 10:
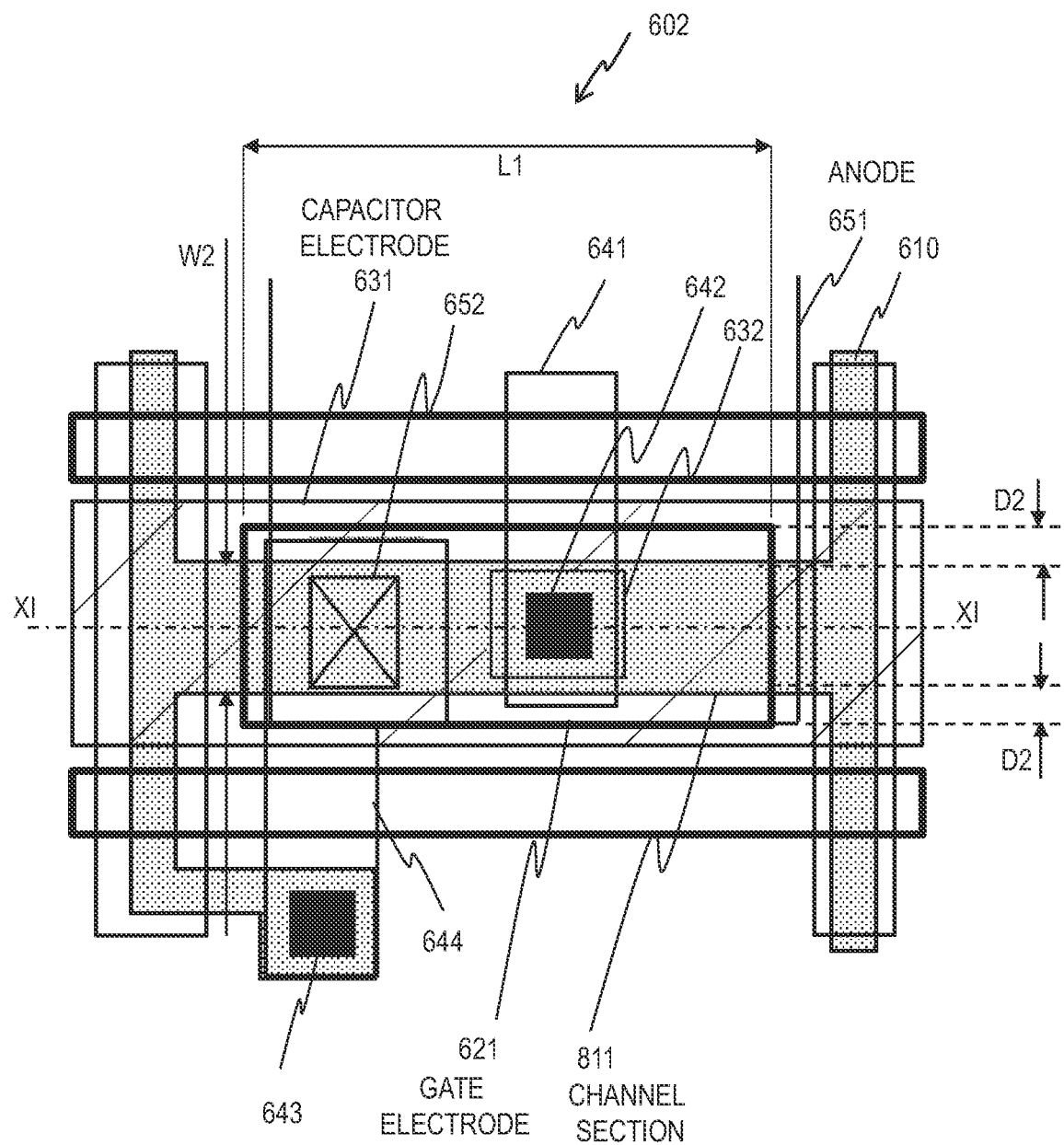
FIG. 10 is a plan view that schematically shows the structure of a drive transistor in a low density region.

FIG. 10 is a plan view that schematically shows the structure of a drive transistor 602 in the low density region 453. For ease of description, some constituent elements are omitted. Components respectively having the same reference characters as the configuration example of FIG. 9 are the same constituent elements as those in FIG. 9. Below, differences from the configuration example of FIG. 9 will be primarily described.

The drive transistor 602 includes a channel section 811 in the semiconductor layer 610. The channel section 811 is rectangular and extends in the horizontal direction of FIG. 10. A width W2 of the channel section 811 is the vertical dimension in FIG. 10, and is constant. The width W2 of the channel section 811 is greater than the width W1 of the channel section of the drive transistor 601 in the normal region 451.

The drive transistors 601 and 602 have the same structure in the normal region 451 and the low density region 453 aside from the channel widths thereof. As a result of the difference in channel width, the channel margins or gate margins between the edges of the channel section and the edges of the gate electrode also differ. In the configuration example of FIG. 10, distances D2 (minimum value) from each edge of the channel section 811 in the vertical direction (width direction) to each edge of the gate electrode 621 are the same on both sides. The distance D2 is less than the distance D1 of the drive transistor 601 in the normal region.

Figure 11:
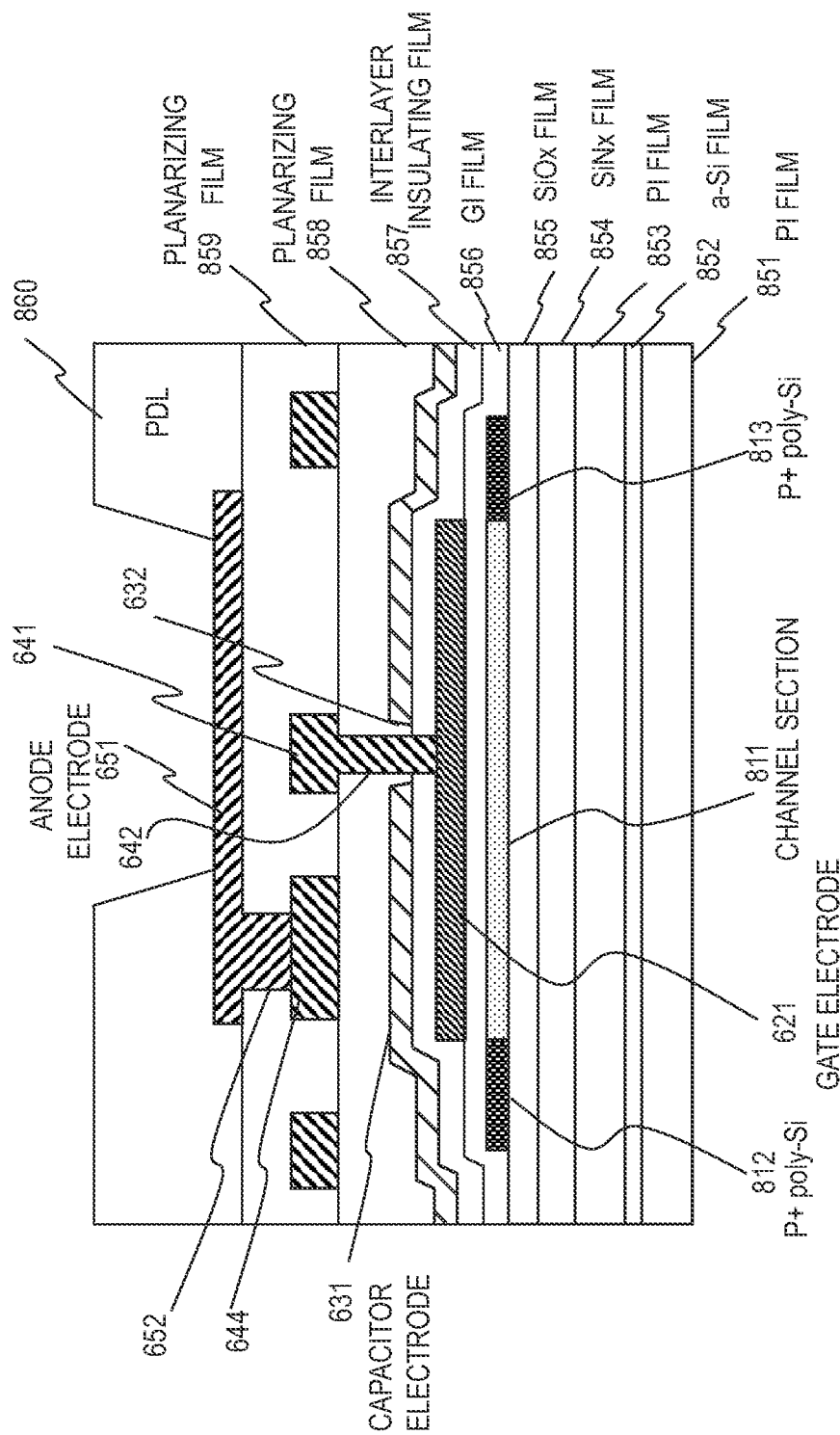
FIG. 11 shows a schematic cross-sectional structure along the line XI-XI of FIG. 10.

FIG. 11 shows a schematic cross-sectional structure along the line XI-XI of FIG. 10. In the description below, the substrate is a flexible substrate. In other configuration examples, a rigid substrate may be used. In the description below, designations of "up" and "down" indicate the up direction or down direction in the drawings.

The flexible substrate is constituted of a plurality of layers. Specifically, the flexible substrate includes a polyimide film 851, an amorphous silicon film 852, a polyimide film 853, a silicon nitride film 854, and a silicon oxide film 855, in the stated order from the bottom. The amorphous silicon film 852 improves adhesion between the polyimide films 851 and 853. The silicon nitride film 854 blocks the movement of moisture to the pixel circuit.

The pixel circuit that controls the OLED element is formed on the silicon oxide film 855. The OLED element is constituted of a lower electrode (e.g., anode electrode 651), an upper electrode (e.g., cathode electrode), and an organic light-emitting multilayer film. Among these elements, FIG. 11 only shows the anode electrode 651.

FIG. 11 is an example of a top emission-type pixel structure. In a top emission-type pixel structure, a cathode electrode (not shown) common to a plurality of pixels is disposed on the side to which light is emitted (the upper side of the drawing; the viewer side). The cathode electrode has a shape that covers the entire display region 125. In the top emission-type pixel structure, the anode electrode 651 reflects light and the cathode electrode is light transmissive.

A bottom emission-type pixel structure has a transparent anode electrode and a reflective cathode electrode, and light is emitted outside (to the viewer side) via the substrate. Additionally, by forming both the anode electrode and the cathode electrode of a light transmissive material, a transparent display device can be realized. The pixel circuit of this disclosure can be applied to either type of OLED display device, and furthermore, can be applied to a display device having a non-OLED light-emitting element.

The drive transistor shown in FIG. 11 has a top-gate structure. The other transistors similarly have a top-gate structure. A polysilicon layer is present on the silicon oxide film 855. The polysilicon layer is present at the location where a channel section 811, made of intrinsic polysilicon that provides transistor properties, would later be formed on the gate electrode 621. On both ends thereof, source/drain regions 812 and 813 that have been doped with a high concentration of impurities in order to attain an electrical connection to the wiring layer thereabove are present.

Between the channel section 811 and the source/drain regions 812 and 813, an LDD (lightly doped drain) that is doped with a low concentration of impurities is sometimes formed. LDDs are omitted from the drawing to avoid an overly complicated depiction. The gate electrode 621 is formed over the polysilicon layer, with a gate insulating film 856 therebetween. The gate electrode is made of molybdenum, for example. An interlayer insulating film 857 is formed on the layer of the gate electrode 621.

The capacitor electrode 631 is formed on the interlayer insulating film 857. The capacitor electrode 631 can be made of the same material as the gate electrode 621, for example. The capacitor electrode 631 has an opening 632 formed therein.

An insulating organic planarizing film 858 covers the capacitor electrode 631 and layers therebelow. The source/drain metal layer including the source/drain electrodes is formed on the planarizing film 858. The source/drain metal layer can be made of a Ti/Al/Ti layered structure, for example. FIG. 11 shows the electrode 641 and the drain electrode 644 included in the source/drain metal layer.

The electrode 641 is connected to the gate electrode 621 via the contact section 642, which penetrates the planarizing film 858, the opening 632 of the capacitor electrode 631, and the interlayer insulating film 857. An insulating organic planarizing film 859 is formed on the source/drain electrode layer. The anode electrode 651 is formed on the planarizing film 859.

The anode electrode 651 is connected to the drain electrode 644 via the contact section 652 of the planarizing film 859. The anode electrode 651 is made of a central reflective metal layer and transparent conductive layers that sandwich the reflective metal layer. An insulating pixel defining layer (PDL) 860 that separates OLED elements is formed on the anode electrode 651. The OLED elements are formed in openings in the pixel defining layer 860.

An organic light-emitting multilayer film (not shown) is formed on the anode electrode 651. An organic light-emitting material is deposited for each RGB color to form the organic light-emitting multilayer film on the anode electrode 651. The organic light-emitting multilayer film is made of a hole injection layer, a hole transport layer, a light-emitting layer, an electron transport layer, and an electron injection layer in the stated order from the bottom. The layer structure of the organic light-emitting multilayer film is determined by design.

A cathode electrode (not shown in FIG. 11) is formed on the organic light-emitting multilayer film. The cathode electrode is a light transmissive electrode. The cathode electrode allows through a portion of visible light from the organic light-emitting multilayer film. The cathode electrode layer is made of a metal such as Al and Mg or an alloy of the foregoing metals, for example. A sealing structure is formed on the cathode electrode.

Figure 12:
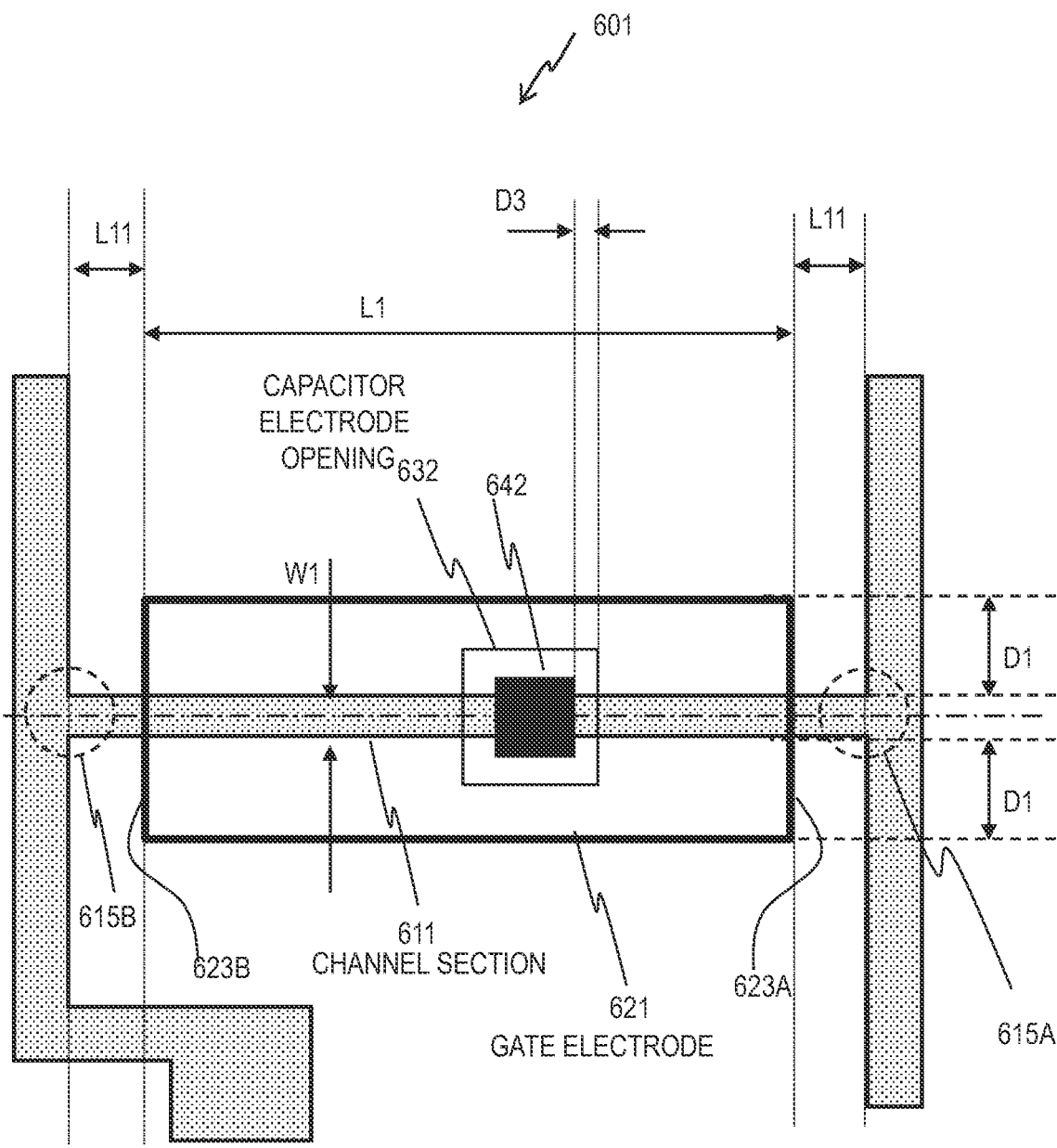
FIG. 12 shows constituent elements of a section of the drive transistor in the normal region.

Below, the structure parameters of the drive transistors will be described. FIG. 12 shows constituent elements of a section of the drive transistor 601 in the normal region 451. Specifically, FIG. 12 shows the semiconductor layer including the channel section 611, the gate electrode 621, and the opening 632 in the capacitor electrode.

The channel section 611 and the gate electrode 621 have a vertically and horizontally symmetrical shape and arrangement. In FIG. 12, the gate electrode 621 and the channel section 611 are rectangles that extend linearly in the horizontal direction, and have the same center axis extending in the horizontal direction. In the width direction of the channel section 611, the distances D1 from the edges of the channel section 611 to the edges of the gate electrode are the same on both sides.

In the configuration example of FIG. 12, a distance L11 from a right edge 623A of the gate electrode 621 to a bend section 615A in the semiconductor layer is the same as a distance L11 from a left edge 623B of the gate electrode 621 to a bend section 615B in the semiconductor layer. In the configuration example of FIG. 12, the bend sections 615A and 615B of the semiconductor layer are T-shaped, but the bend sections may be L-shaped. The angles of the bend sections need not necessarily be right angles.

As described with reference to FIG. 9, the capacitor electrode 631 is disposed so as to cover the channel section 611 and the gate electrode 621. Additionally, the gate electrode 621 is connected to the source/drain metal layer by the contact section 642 via the opening 632 formed in the capacitor electrode 631.

As shown in FIG. 12, the center axis of the gate electrode 621 passes through the region where the contact section 642 contacts the gate electrode. Also, a gap of a distance D3 (minimum distance) is present between the inner edge (opening edge) of the opening 632 formed in the capacitor electrode 631 and the contact section 642.

Figure 13:
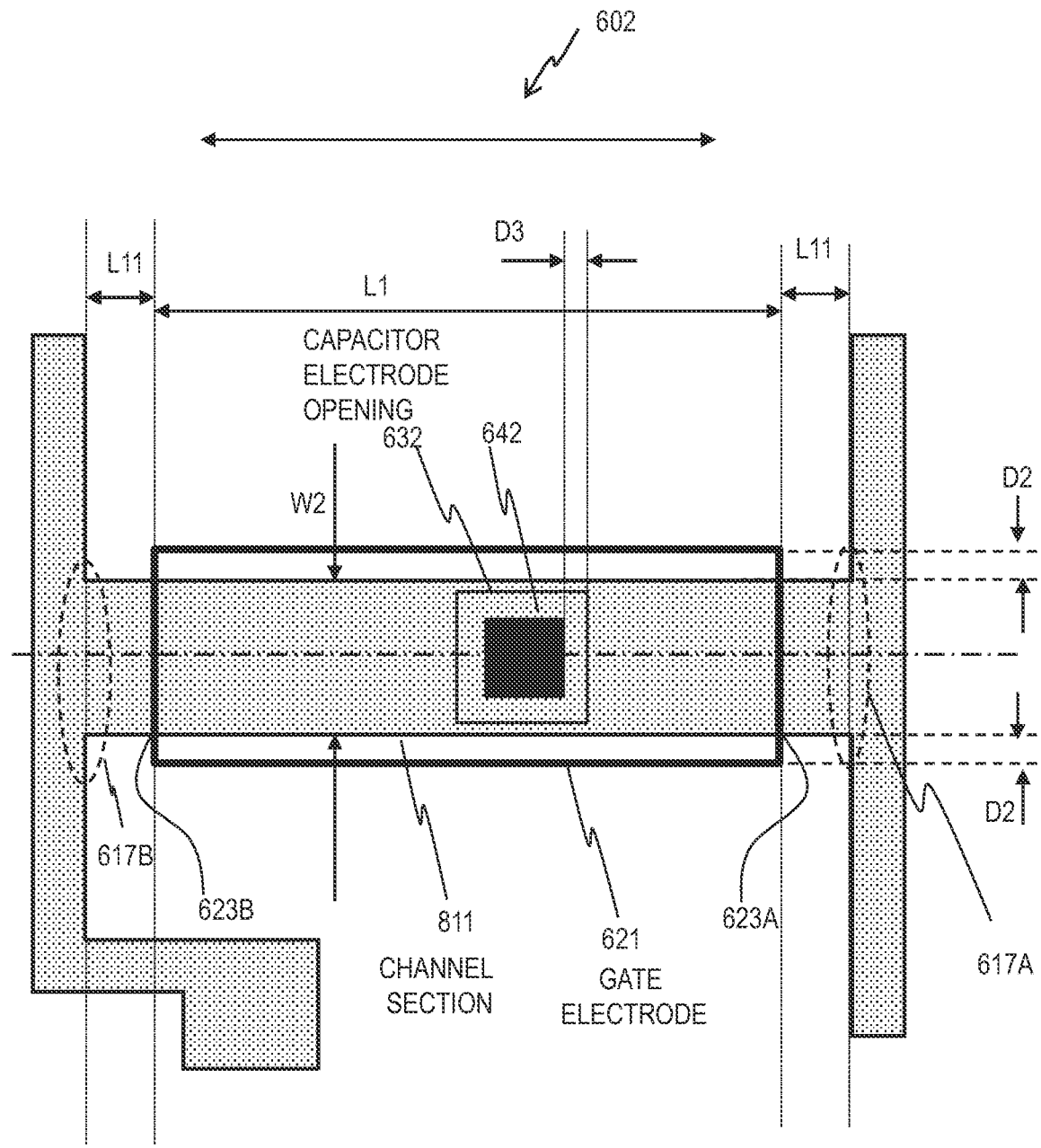
FIG. 13 shows constituent elements of a section of the drive transistor in a low density region.

FIG. 13 shows constituent elements of a section of the drive transistor 602 in the low density region 453. Specifically, FIG. 13 shows the semiconductor layer including the channel section 811, the gate electrode 621, and the opening 632 in the capacitor electrode. Compared to the drive transistor 601 in the normal region 451 shown in FIG. 12, the width W2 of the channel section 811 is greater. In other words, the width of the semiconductor overlapping the gate electrode 621 (second gate electrode) in the low density region 453 is greater than the width of the semiconductor overlapping the gate electrode 621 (first gate electrode) in the normal region 451. Other structures including the shape of the gate electrode 621 are similar to the drive transistor 601.

The channel section 811 and the gate electrode 621 have a vertically and horizontally symmetrical shape and arrangement. In FIG. 13, the gate electrode 621 and the channel section 811 are rectangles that extend linearly in the horizontal direction, and have the same center axis extending in the horizontal direction. In the width direction of the channel section 811, the distances D2 from the edges of the channel section 811 to the edges of the gate electrode are the same on both sides. The distance D2 is less than the distance D1 of the drive transistor 601 in the normal region.

The distance L11 from the right edge 623A of the gate electrode 621 to a bend section 617A in the semiconductor layer is the same as the distance L11 from the left edge 623B of the gate electrode 621 to a bend section 617B in the semiconductor layer. The distance L11 is the same as the distance L11 of the drive transistor 601 in the normal region. In the configuration example of FIG. 13, the bend sections 617A and 617B of the semiconductor layer are T-shaped, but the bend sections may be L-shaped. The angles of the bend sections need not necessarily be right angles.

As described with reference to FIG. 10, the capacitor electrode 631 is disposed so as to cover the channel section 811 and the gate electrode 621. Additionally, the gate electrode 621 is connected to the source/drain metal layer by the contact section 642 via the opening 632 formed in the capacitor electrode 631.

As shown in FIG. 13, the center axis of the gate electrode 621 passes through the region where the contact section 642 contacts the gate electrode. Also, a gap of a distance D3

(minimum distance) is present between the inner edge of the opening 632 formed in the capacitor electrode 631 and the contact section 642. The distance D3 of the gap is the same as the distance D3 of the gap of the drive transistor 601 in the normal region.

As described above, the central axes of the gate electrode and the channel section of the drive transistor match, and the width direction distances (gate margins) D1 or D2 therebetween are the same on both sides. As a result, it is possible to reduce the effect of fluctuations in the manufacturing process for the drive transistors having differing channel widths. Additionally, the distances between the edges of the gate electrode and the bend sections of the semiconductor layer are the same on both ends. As a result, it is possible to reduce the effect of fluctuations in the manufacturing process for the drive transistors having differing channel widths. One set of distances may differ between both sides.

As described above, the capacitor electrode 631 is arranged so as to cover the channel section 611 or 811, and forms a storage capacitance together with the gate electrode 621 therebelow. Additionally, the contact section 642 of the source/drain metal layer and the gate electrode 621 is formed through the opening 632 formed in the capacitor electrode 631.

In order to prevent impacts on circuit operation due to differences in channel width, it is important to reduce the difference in fringe capacitance of the wiring lines (electrodes) connected directly to the gate electrodes. By disposing the contact section in the vicinity of the center on the opposite side of the gate electrode from the perspective of the channel side, it is possible to effectively reduce the difference in fringe capacitance.

As described above, by shielding the gate electrode of the drive transistor with the capacitor electrode layer and leading out the gate electrode via a small opening, it is possible to effectively mitigate fluctuations in Vgs, which directly affects the output current, due to capacitance coupling with other wiring lines.

In one embodiment of the present specification, the distance D3 (minimum value) between the inner edge of the opening 632 of the capacitor electrode and the contact section 642 of the gate electrode is greater than the distance D2 (minimum value) between the edge of the gate electrode 621 and the edge of the channel section 811 in the drive transistor 602 of the low density region. As a result, it is possible to reduce the effect of errors in the manufacturing process.

Specifically, the shape of the layer of the gate electrode 621 is aligned with respect to the semiconductor layer and the shape of the capacitor electrode 631 is aligned with respect to the layer of the gate electrode 621. The shape of the source/drain metal layer is aligned with respect to the layer of the gate electrode 621 or the semiconductor layer. Thus, the alignment of the contact section 642 of the source/drain metal layer with respect to the opening 632 of the capacitor electrode is a combination of two alignments (indirect alignment). Thus, by setting the distance D3 to be greater than the distance D2, the possibility of contact between the contact section 642 and the capacitor electrode 631 due to variations in the manufacturing process can be reduced.

The description with reference to FIGS. 12 and 13 can be applied to other switch transistors where sections concerning the distance D3 are excluded and different channel widths are used for the normal region 451 and the low density region 453.

As set forth above, embodiments of this disclosure have been described; however, this disclosure is not limited to the foregoing embodiments. Those skilled in the art can easily modify, add, or convert each element in the foregoing embodiments within the scope of this disclosure. A part of the configuration of one embodiment can be replaced with a configuration of another embodiment or a configuration of an embodiment can be incorporated into a configuration of another embodiment.

What is claimed is:

1. A display device, comprising:
a first display region; and
a second display region having a lower pixel density than the first display region;
wherein a first pixel circuit in the first display region includes:
a first drive transistor that controls a drive current amount to a light-emitting element;
a first storage capacitor that stores a control voltage of the first drive transistor; and
a first switch transistor that writes a data signal to the first storage capacitor,
wherein a second pixel circuit in the second display region includes:
a second drive transistor that controls a drive current amount to a light-emitting element;
a second storage capacitor that stores a control voltage of the second drive transistor; and
a second switch transistor that writes a data signal to the second storage capacitor,
wherein a channel width of the second drive transistor is greater than a channel width of the first drive transistor, and
wherein a channel width of the second switch transistor is greater than a channel width of the first switch transistor.

2. The display device according to claim 1,
wherein a gate potential fluctuation in the first drive transistor resulting from switching the first switch transistor from ON to OFF is equal to a gate potential fluctuation in the second drive transistor resulting from switching the second switch transistor from ON to OFF.

3. The display device according to claim 1,
wherein the first pixel circuit further includes a third switch transistor that electrically connects a gate to a drain of the first drive transistor when in an ON state,
wherein the second pixel circuit further includes a fourth switch transistor that electrically connects a gate to a drain of the second drive transistor when in an ON state, and
wherein a channel width of the fourth switch transistor is greater than a channel width of the third switch transistor.

4. The display device according to claim 3,
wherein a gate potential fluctuation of the first drive transistor resulting from switching the third switch transistor from ON to OFF is equal to a gate potential fluctuation in the second drive transistor resulting from switching the fourth switch transistor from ON to OFF.

5. The display device according to claim 1,
wherein the first drive transistor includes a first gate electrode,
wherein the second drive transistor includes a second gate electrode,
wherein a shape of the first gate electrode is the same as a shape of the second gate electrode, and wherein a width of a semiconductor overlapping the second gate electrode is greater than a width of a semiconductor overlapping the first gate electrode.

6. The display device according to claim 5,
wherein distances from both edges of the first gate electrode to bend sections of a semiconductor layer are the same, and
wherein distances from both edges of the second gate electrode to bend sections of a semiconductor layer are the same.

7. The display device according to claim 5,
wherein a center axis of the first gate electrode matches a center axis of a channel of the first drive transistor in a plan view, and
wherein a center axis of the second gate electrode matches a center axis of a channel of the second drive transistor in a plan view.

8. The display device according to claim 7, further comprising:
a first capacitor electrode, of the first storage capacitor, that covers the channel and the first gate electrode of the first drive transistor, and that has an opening;
a second capacitor electrode, of the second storage capacitor, that covers the channel and the second gate electrode of the second drive transistor, and that has an opening;
a first contact section that contacts the first gate electrode via the opening of the first capacitor electrode; and
a second contact section that contacts the second gate electrode via the opening of the second capacitor electrode,
wherein the center axis of the first gate electrode passes through a region where the first contact section contacts the first gate electrode, and
wherein the center axis of the second gate electrode passes through a region where the second contact section contacts the second gate electrode.

9. The display device according to claim 8,
wherein a minimum value of a distance between the first contact section and an opening edge of the first capacitor electrode is greater than a minimum value of a distance between an edge of the first gate electrode and an edge of the channel of the first drive transistor in a direction of the channel width of the first drive transistor, and
wherein a minimum value of a distance between the second contact section and an opening edge of the second capacitor electrode is greater than a minimum value of a distance between an edge of the second gate electrode and an edge of the channel of the second drive transistor in the direction of the channel width of the second drive transistor.

* * * * *